United States Patent [19]
Erdmann

[11] Patent Number: 5,522,929
[45] Date of Patent: Jun. 4, 1996

[54] APPARATUS FOR MATERIAL DEPOSITION FOR CIRCUIT BOARD MANUFACTURE

[76] Inventor: Gunter Erdmann, 18 Ponderosa La., Walpole, Mass. 02032

[21] Appl. No.: 297,595

[22] Filed: Aug. 29, 1994

[51] Int. Cl.$^6$ ...................................................... B05C 7/00
[52] U.S. Cl. ........................ 118/120; 118/213; 118/242; 118/254; 118/406; 118/413; 101/123
[58] Field of Search .................................... 118/120, 213, 118/242, 254, 406, 413, 504; 101/114, 123, 126, 129; 427/96, 97, 282

[56] References Cited

U.S. PATENT DOCUMENTS

| | | | |
|---|---|---|---|
| 4,009,047 | 2/1977 | Lindsay | 134/9 |
| 4,781,114 | 11/1988 | Ericsson | 101/123 |
| 4,919,970 | 4/1990 | Hoebener et al. | 427/96 |
| 5,044,306 | 9/1991 | Erdmann | 118/120 |
| 5,050,496 | 9/1991 | Klemm | 101/123 |
| 5,254,362 | 10/1993 | Shaffer et al. | 427/96 |
| 5,332,439 | 7/1994 | Watanabe et al. | 118/406 |
| 5,388,508 | 2/1995 | Dubuit | 101/123 |

FOREIGN PATENT DOCUMENTS

| | | |
|---|---|---|
| 63-199643 | 8/1988 | Japan . |
| 4-338541 | 11/1992 | Japan . |

OTHER PUBLICATIONS

Global Manufacturing, Inc. (1992) "Innovations in Technology".

Primary Examiner—Laura Collins
Attorney, Agent, or Firm—Lahive & Cockfield

[57] ABSTRACT

This invention improves a machine that has a squeegee-like blade that wipes across an apertured mask to apply to a printed circuit board solder paste or other conductive mounting material. The apparatus and method of the invention involve reciprocating the blade back and forth transverse to the direction of blade sweep across the mask, during the material-applying sweep of the blade across the mask. The reciprocating movement of the blade, combined with the sweep movement, deposits material onto the printed circuit board with high fidelity and with minimal voids.

5 Claims, 2 Drawing Sheets

APPARATUS FOR MATERIAL DEPOSITION FOR CIRCUIT BOARD MANUFACTURE

FIELD OF THE INVENTION

This invention relates generally to an apparatus and method for the manufacture of electrical circuit devices and, more particularly, to an apparatus and method for depositing conductive mounting material through an apertured mask with high fidelity even through small mask apertures. One particular application of the invention relates to surface mount technology where solder paste, or other conductive mounting material, is selectively applied to a printed circuit board (PCB) through an apertured mask by a squeegee-like blade.

BACKGROUND OF THE INVENTION

A common technique for manufacturing PCBs employs surface mount technology, where components are secured to conductive pads on the surface of the circuit board. Conductive paths in or on the circuit board interconnect the pads. Components are affixed to these pads by conductive mounting materials, referred to hereinafter as mounting materials. These mounting materials are compounds with both adhesive and electrical conduction properties, such as solder paste and conductive epoxy. Solder paste is a viscous paste that includes finely ground solder particles in a flux base. Conductive epoxies are organic compounds which have adhesive properties sufficient to secure electrical components to circuit boards and which are electrically conductive. A variety of conductive epoxies are available, for example, from Epoxy Technology, Inc., Billerica, Mass.

In one known practice, solder paste is printed onto a circuit board through an apertured mask placed in selected registration over the circuit board. A material-applying sweep by a squeegee-like blade across the mask applies the solder paste to the circuit board in a pattern reflective of the apertures in the mask. Generally, the application of solder paste, or other mounting material, to a circuit board occurs with a single sweep of the blade. The use of multiple sweeps, or multiple blades, is commonly deemed undesirable. After each sweep of the blade, the processed circuit board is removed and replaced with a fresh board. After applying solder paste to the circuit board, leads of various electronic components are placed on the PCB at the sites bearing the solder paste. The solder paste is then heated and allowed to cool, thereby securing the components to the board and connecting them electrically to the conductive runs in the board.

A considerable problem in PCB production relates to the fidelity of applying the mounting material. Fidelity, as used herein, includes resolution, reproducibility and definition. Herein, resolution refers to the minimum distance between two adjacent mask apertures capable of ensuring no inadvertent contact between mounting material sites on the circuit board. Reproducibility refers to the maximum variation in mounting material patterns between any two PCBs produced with the same mask. Definition refers to the precision with which the mounting material pattern reflects the aperture pattern of the mask. Common fidelity problems include, for example, contamination of the mask bottom with mounting material and void spaces in the mounting material deposited on the circuit boards. Void spaces in the deposited mounting material become increasingly pronounced with decreasing size of the mask apertures. Fidelity problems are of significant concern with PCBs designed to accommodate high densities of components; minute errors in mounting material placement can render these boards useless. Fidelity limitations presently determine the maximum allowable density of PCB components. Increasing the fidelity of mounting material application will allow for the low cost, mass production of PCBs with higher densities of components than is presently possible.

Attempts to increase the fidelity of the mounting material application process include increasing the pressure exerted by the blade upon the mask, using slow blade sweep rates, and using angular blade sweeps across the mask. Each of these techniques suffers from disadvantages. Increased blade pressure decreases mask life, increases blade wear, and scavenges mounting material from mask apertures. Scavenging of mounting material occurs when the blade, during the sweep, dips into an aperture and scoops out material from that aperture. Other PCB production problems amplified by increased blade pressures are "screen stretch" and contamination of the mask bottom with mounting material. "Screen stretch" is caused by friction between the blade and the mask, which stretches the mask in the direction of the sweep. Contamination of the bottom of the mask with mounting material results in mounting material being applied outside the desired mask pattern and requires cleaning of the mask.

Slow blade movement across the mask may somewhat increase the resolution and definition of mounting material deposition, however, it increases the time to process each circuit board and hence reduces manufacturing rates and increases costs.

The use of an angular sweep to spread mounting material across a mask can somewhat increase the fidelity of mounting material application. One application of this method involves sweeping a blade, which is set at an angle to the sweep direction, down the length of the mask so that the blade passes over the mask apertures, which generally are placed on X and Y axes, at oblique angles. This method of applying mounting material, however, is impractical for the mass production of PCBs due to spacial constraints. To prevent shifting of the mask in a typical current practice, a four-sided frame of minimal size holds the mask tightly in place by securing it on all four sides. As such, when a blade makes an angular sweep, limitations on available space result in solder paste not being applied to two corners of the mask surface.

Accordingly, one objective of the present invention is to provide an apparatus and a method that increases the fidelity of mounting material application in circuit board manufacturing. A particular objective is to more readily attain the mass production of PCBs having a relatively high density of components than is available with conventional production methods. Another object is to reduce wear of both the mask and the squeegee-like blade. Other objects are to allow for the use of a low weight blade and carriage assembly, and to reduce "screen stretch." A further object is to increase the production rate of circuit boards by increasing the allowable sweep rate of the blade across the mask. An additional object is to reduce scavenging of mounting material by the blade.

The invention accordingly comprises the several steps and the relation of one or more such steps with respect to each of the others, and the apparatus embodying features of construction, combinations of elements and arrangements of parts adapted to effect such steps, all as further exemplified in the following detailed disclosure, and the scope of the invention is indicated in the claims.

GENERAL DESCRIPTION OF THE INVENTION

The invention attains the foregoing objects by providing a machine that has an elongated squeegee-like blade element that wipes across an apertured mask to apply to a printed circuit board, or other substantially flat circuit element, solder paste or other extrudable conductive mounting material. The apparatus and method of the invention involve reciprocating the blade element back and forth transverse to the direction of the blade sweep across the mask, during the material-applying sweep of the blade element across the mask. As used herein, sweep refers to the material-depositing movement of the blade element across the mask surface, it commonly involves a continuous linear motion.

The reciprocating motion of the blade element, during the material-applying sweep, enhances the fidelity of material deposition without increasing the pressure of the blade on the mask and without reducing sweep rates. The reciprocating motion of the blade element, during the sweep movement, is believed to subject the mounting material to new degrees of shear stress which enhances the deposition of the material through the mask apertures with high fidelity and with minimal voids, even when the openings in the mask are exceedingly small.

In one preferred practice of the invention, the apparatus has a blade element mounted for reciprocating movement transverse to the sweep direction and employs a reciprocating motor, separate from the sweep drive, for such reciprocation. A control unit synchronizes the action of the reciprocating motor with that of the sweep drive during the material-applying sweep. For example, one prototype reciprocated the blade element at 60 cycles/second and swept the blade element across the mask at 2 inches/second, while a second prototype reciprocated the blade element at 120 cycles/second and swept at 4 inches/second. In addition, the control unit can selectively regulate at least two parameters of the reciprocation movement, namely the frequency of reciprocation and the length of the reciprocation stroke.

Various reciprocating frequencies and reciprocating stroke lengths are suitable for practicing this invention. Generally, it is desirable for the length of the reciprocation stroke to vary between 0.1 and 2.0 mm and for the frequency of reciprocation to vary between 5 and 200 cycles/second. Appropriate reciprocating frequencies and stroke lengths may be selected by analyzing, among other factors, the mass of the blade element, the size of particulates contained in the extrudable mounting material, the dimensions of apertures in the mask, and the sweep rate.

The invention is typically used with frames which removably and replaceably hold an apertured mask and a circuit board, or other substantially flat circuit element, in selected registration. The apertured mask and the circuit board are held in a co-planar orientation such that the blade element travels across the mask surface, during the material-applying sweep, while reciprocating transverse to the sweep direction.

The reciprocating motor can be any type of drive mechanism which the control unit can regulate and which is capable of reciprocating the blade element substantially transverse to the sweep direction. Examples of such reciprocating motors include pneumatic actuators and electric motors.

Depending on the particular application, a blade element according to this invention may vary in shape and angle of contact with the surface. In addition, the blade element can be composed of either a resilient material, such as a durable metal, or a flexible material, such as a plastic or other elastomeric compound. Flexible blade elements utilized may have high or low durometer ratings. Unlike prior systems, the invention advantageously can be used to produce high fidelity prints with low durometer blade elements. The reciprocating motion, as disclosed herein, allows extrudable material to be applied with high fidelity without applying high pressure to the low durometer blade element, thus significantly reducing the scavenging generally associated with low durometer blades.

The method of this invention involves spreading an extrudable material onto a printed circuit board, or other substantially flat circuit element, through an apertured mask while reciprocating the material-applying blade element concurrent with the material-applying sweep. This method preferably includes regulating either the reciprocation frequency or stroke length, or both.

In one embodiment, a method according to the present invention includes the steps of placing a circuit board in selected registration below a selectively apertured mask, applying an extrudable material to the top surface of the apertured mask, sweeping a blade element across the top surface of the mask to apply the extrudable material through the mask apertures to the circuit board below, and reciprocating the blade element transverse to the sweep direction during the material-applying sweep.

The extrudable materials that can be applied by the invention include, but are not limited to: solder, conductive epoxy, electrical insulators, and ink.

The above and further features of the invention are set forth with particularity in the claims and will be understood from consideration of the following description of illustrative embodiments with reference to the accompanying drawings.

BRIEF DESCRIPTION OF THE FIGURES

For a fuller understanding of the nature and objects of the invention, reference may be had to the following detailed description and the accompanying drawings, in which.

DESCRIPTION OF ILLUSTRATED EMBODIMENTS

Figure 1:
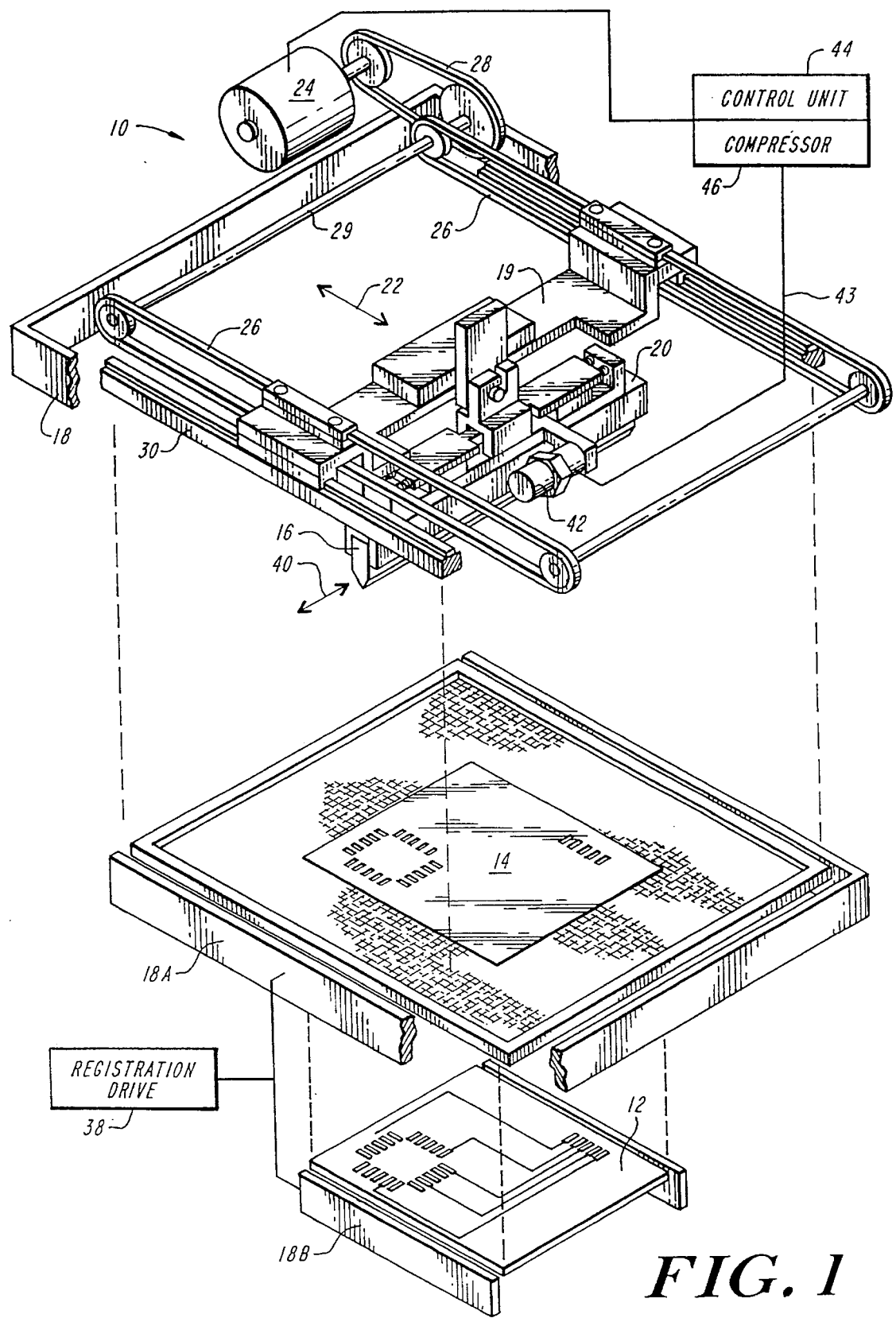
FIG. 1 is a fragmentary exploded view, in perspective, of a circuit board manufacturing machine according to the invention. The registration drive and the control elements for the sweep drive and the reciprocating motor are shown in block form.

FIG. 1 shows a circuit board manufacturing machine 10 according to the invention for applying an extrudable material to a circuit board 12 through an apertured mask 14 by movement of a blade element 16 across the mask surface. The illustrated machine 10 performs one of many steps in the manufacturing of circuit board 12, namely applying extrudable materials to circuit board 12. The machine 10 has a pair of substantially parallel guide rails 30 mounted to frame 18. The sweep arm 19 is secured to the machine frame 18 by guide rails 30. The sweep arm 19 slides along the length of the guide rails 30 and carries the blade unit 20 in the direction of the arrow 22. The guide rails 30 allow for the sweeping motion of the sweep arm 19 back and forth across the surface of the apertured mask 14 in the direction of the arrow 22. Thus, the sweep arm 19 can move along the rails 30 across the surface of the apertured mask 14 with a continuous linear motion in the direction of the arrow 22.

The motion of the sweep arm 19 is controlled by a sweep drive 24. The sweep drive 24, typically an electrical motor, is coupled to a sweep drive belt 28 which, in turn, is coupled to a drive shaft 29. The drive shaft 29 is coupled to a blade unit drive belt 26 that connects directly to the sweep arm 19. Thus, the driving action of the sweep drive 24 is translated to sweep arm 19 through the sweep belt drive 28, the drive shaft 29 and the blade unit drive belt 26.

The apertured mask 14 and the circuit board 12 are each removably and replaceably held in frame sections 18A and 18B, respectively. Frame sections 18A and 18B support a circuit board 12 in a plane parallel to the apertured mask 14. A registration drive 38 selectively provides precision control movement of one frame section relative to the other to align the circuit board 12 precisely with, and in abutment with, the apertured mask 14. Registration drives are known in the art and may consist of registration pins placed in frame section 18A and corresponding apertures placed in frame section 18B. The pins of frame section 18A fit only within their respective apertures in frame section 18B, thereby correctly aligning the apertures in mask 14 with surface mount pads on circuit board 12. Alternatively, registration drives may consist of sensing and mechanical elements. The sensing element, for example an optical unit, determines the alignment of the circuit board 12 with the apertured mask 14 and directs the mechanical element to place the board and the mask in selected registration. This selected registration between the circuit board 12 and the apertured mask 14 is such that the extrudable material 48 is applied, during a material-applying sweep of the blade element 16, through the mask apertures to locations on the circuit board 12 corresponding to surface mount pads.

As further shown in FIG. 1, the circuit board manufacturing machine 10, in accord with the invention, provides a reciprocating motor 42 that reciprocates the blade element 16 back and forth in a direction transverse to the sweep direction and indicated by the arrow 40. As drawn in FIG. 1, the reciprocating motor 42 is a pneumatic vibrator. One example of this vibrator is marketed by Global Manufacturing, Inc., Little Rock, Ark. The control unit 44 regulates the rate of reciprocation of the blade element 16 and the length of the reciprocation stroke by controlling the air flow from the compressor 46, through the air line 43, to the reciprocating motor 42. Both the rate of reciprocation of the blade element 16 and the length of the reciprocation stroke vary with the air pressure delivered to the pneumatic vibrator and with the particular vibrator used. The control unit 44 is also connected to the sweep drive 24 to coordinate the transverse blade movement with the sweep movement.

Further embodiments of the invention can employ either electric motors, piezoelectric actuators, or other vibration generators as reciprocating motor 42. Control unit 44 then regulates the reciprocation frequency and the length of the reciprocating stroke by controlling the electrical drive applied to the electric motor.

Under certain conditions, it is preferable that blade element 16 reverse direction over every aperture in mask 14 at least once to increase shear stress. To guarantee blade element 16 reverses direction over each aperture, blade element 16 must complete at least one period of reciprocating motion along direction 40 before sweep arm 19 moves a distance along direction 22 equal to the length of the smallest aperture in mask 14 along direction 22. Alternatively, because the frequency of a periodic motion equals the reciprocal of the periodic length, to guarantee the reversal of blade element 16 the frequency of reciprocation must equal or exceed the velocity of sweep arm 19 divided by the length of the smallest aperture. In mathematical terms, the preferred frequency of oscillation, F, for blade element 16 can be calculated as follows:

$$F > \frac{V_D}{d}$$

where "$V_D$" is the speed of sweep arm 19 and "d" is the distance across the smallest aperture along direction 22.

Figure 2:
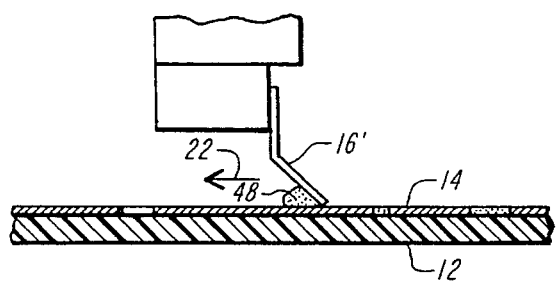
FIG. 2 is a schematic cross-sectional view of a blade element applying an extrudable material to a circuit board and illustrating a blade element different from that of FIG. 1.

FIG. 2, shows a side elevation view of a blade element 16'—illustrated as having a different construction from the blade element 16 of FIG. 1—during a material-applying sweep. As the blade element 16' sweeps across the apertured mask 14 in the direction of the sweep arrow 22, the blade element 16' reciprocates back and forth in a direction transverse to the arrow 22 and deposits the extrudable material 48 through the apertures of the mask 14 onto the surface mount pads (not shown) of the circuit board 12. The reciprocation of the blade element 16' transverse to the sweep direction shown by the arrow 22 is understood to cause the blade element 16' to subject the mounting material 48 to shear stress in addition to that produced by the sweep movement, and which enhances the deposition of the material, with exceeding fidelity, onto the circuit board through all apertures of the mask.

Figure 3:
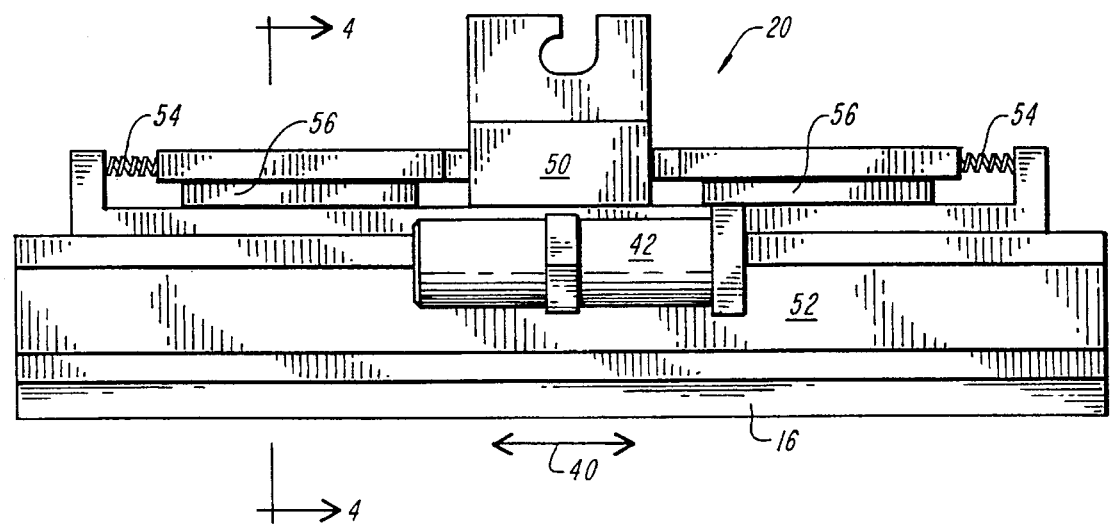
FIG. 3 is a frontal elevation view of the blade unit of the machine of FIG. 1.
Figure 4:
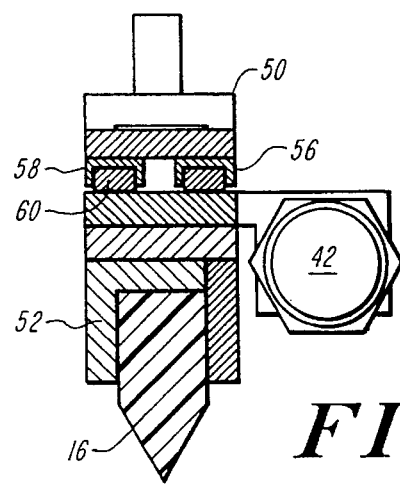
FIG. 4 is a cross-sectional view of the blade unit according to the present invention and taken along section line 4—4 of FIG. 3.

FIGS. 3 and 4 show illustrated blade unit 20 having a non-reciprocating blade mount 50 and a reciprocating blade holder 52, to which the blade element 16 is attached. The blade mount 50 attaches firmly and securely to the sweep arm 19 for movement with it along the sweep direction 22. The mounting of the sweep arm 19 with the frame rails 30 holds the arm 19, and correspondingly the mount 50 essentially stationary with respect to movement along the transverse axis 40.

The blade holder 52 is attached to and mounted with the mount 50 for movement with it along the sweep axis 22 and, further, is free to undergo transverse movement, i.e. movement along the traverse axis 40. The blade holder 52 is attached to the blade mount 50 by a pair of opposed restoring springs 54 and by linear bearings 56. The two restoring springs are aligned parallel to the transversal axis 40. Each spring is interposed between transversely opposite ends of the mount 50 and of the holder 52. The linear bearings 56 consist of a non-reciprocating track 58 on the blade mount 50 and a reciprocating rail 60 on the blade holder 52. The linear bearing 56 attaches the blade holder 52 to the blade mount 50 while allowing for a sliding action of the blade holder 52 transverse to the sweep direction.

The illustrated reciprocating motor 42 applies to the blade holder 52 vibrational energy directed back and forth along the transverse axis 40. The control unit 44 preferably operates the compressor 46 to limit this transverse movement to occur only during a material-applying sweep of the blade element 16. In response to this vibrational energy, the blade holder 52 moves transversely, in the direction of arrow 40, during the material-applying sweep. The compressed reciprocation springs 54 of the blade holder 52 provide a restoring force which counteracts the vibrational energy of the reciprocating motor 42 and tends to drive the blade holder 52 back to a center position after each transverse movement off the center axis. Thus, the restoring forces generated by the reciprocation springs 54, when combined with the vibrational energy of the reciprocating motor 42, drives the transverse reciprocating motion of the blade holder 52.

The shape of the blade element 16 and the angle of blade contact with the apertured mask 14 can be selected, following practices known in this art. FIG. 2 shows a blade element 16' where the lower portion of the blade 16 is angled in the direction opposite to the sweep direction 22. FIG. 4 shows another embodiment the blade element 16 where the blade 16 is held in a plane perpendicular to the surface of the apertured mask 14. In this embodiment, however, the lower portions of the sides of the blade element 16 are beveled such that the blade 16 has an edge which contacts the surface of the apertured mask 14.

In summary, a circuit board manufacturing machine 10, as exemplified in FIG. 1, applies an extrudable material 48 through an apertured mask 14 to a circuit board 12, or other substantially flat circuit element, with high resolution using a blade element 16 which reciprocates transverse to the sweep direction 22, during a material-applying sweep. The circuit board manufacturing machine 10 applies the extrudable material 48 with high fidelity and minimum voids to locations corresponding to the surface mounted pads on the circuit board 12, held in selected and precise registration with the apertured mask 14. The reciprocation rate and the length of the reciprocation stroke are regulated by a control unit 44, which preferably also synchronizes the reciprocating movement of the blade element 16 with the sweeping action of the sweep arm 19.

The described invention may be used in semi-automated systems requiring an operator, or alteratively in fully automated systems wherein machines perform all functions. For example, in a semi-automated system, an operator can manually load mask 14 and circuit board 12 into the frame sections, align the apertures in mask 14 with the desired locations on circuit board 12, and then initiate the machine controlled movement of blade element 16. Comparatively, in a fully automated system, machines control the loading and aligning of mask 14 and circuit board 12, and the movement of blade element 16.

While the invention has been shown and described having reference to a specific preferred embodiment those skilled in the art will understand that variations in form and detail may be made without departing from the spirit and scope of the invention.

Having described the invention, what is claimed as new and secured by Letters Patent is:

1. In printed circuit manufacturing apparatus for applying an extrudable material through a selectively apertured mask, the improvement comprising A) a blade element elongated along a first axis and having a thickness along a transverse second axis and selectively movable along at least each of said first and second axes, wherein said blade element, during such movement along said second axis, transfers extrudable material through an apertured mask onto a printed circuit board, B) a bearing mounting said blade element in said apparatus for linear movement of said blade element along said first axis, and C) a reciprocating motor coupled with said blade element for reciprocating said blade element along said first axis concurrent with movement of the blade element along said second axis.

2. In apparatus according to claim 1, the further improvement comprising a reciprocation control unit coupled with said reciprocating motor for selectively adjusting at least one parameter of blade element movement selected from the parameters of frequency of reciprocation and length of reciprocation stroke.

3. In printed circuit manufacturing apparatus for applying an extrudable material through a selectively apertured mask, the improvement comprising A) a blade element elongated along a first axis and having a thickness along a transverse second axis, B) a blade mount mounting said blade element for linear reciprocating movement of the blade element relative to the blade mount along said first axis, C) a sweep drive connected with said blade mount for moving the blade mount and the blade element along said second axis, and D) a reciprocating motor coupled with said blade element for reciprocating said blade element relative to said blade mount concurrent with movement of the blade mount along said second axis, and E) a control unit coupled with said reciprocating motor for selectively regulating at least one of the length of reciprocation and the frequency of reciprocation of the blade element.

4. In apparatus according to claim 3, the further improvement comprising a linear bearing coupling said blade element to said blade mount for said reciprocating movement of said blade element relative to said blade mount.

5. Primed circuit manufacturing apparatus for applying an extrudable material through a selectively apertured mask, said apparatus having the improvement comprising A) a frame for disposing a replaceable and removable mask in a plane defined by first and second transverse axes and in selected registration with a removable and replaceable circuit board, B) a blade element elongated along said first axis and having a thickness along said second axis and mounted with said frame for selected relative movement along at least each of said first and second axes, C) a bearing mounting said blade element in said apparatus for linear movement of said blade element along said first axis, and D) a drive mechanism coupled with said blade element for reciprocating said blade element along said first axis concurrent with movement of the blade along said second axis.

* * * * *